United States Patent [19]

Brewer

[11] Patent Number: 4,543,447

[45] Date of Patent: Sep. 24, 1985

[54] ELECTROMAGNETIC SHIELDING DEVICE

[75] Inventor: Ronald W. Brewer, Bushhill, Pa.

[73] Assignee: Instrument Specialties Co., Inc., Delaware Water Gap, Pa.

[21] Appl. No.: 493,159

[22] Filed: May 10, 1983

[51] Int. Cl.⁴ .............................................. H05K 9/00
[52] U.S. Cl. .................................. 174/35 GC; 411/373
[58] Field of Search ............. 174/35 R, 35 C, 35 GC, 174/35 MS, 51; 411/373, 371, 533, 544; 277/236

[56] References Cited

U.S. PATENT DOCUMENTS

| | | | |
|---|---|---|---|
| 2,527,053 | 10/1950 | Bedford, Jr. | 411/371 |
| 3,277,230 | 10/1966 | Stickney et al. | 174/35 GC |
| 4,334,259 | 6/1982 | Edwards | 174/35 GC X |
| 4,384,165 | 5/1983 | Loving et al. | 174/35 GC |

Primary Examiner—A. T. Grimley
Assistant Examiner—D. A. Tone
Attorney, Agent, or Firm—Burns, Doane, Swecker & Mathis

[57] ABSTRACT

The present invention relates to an electromagnetic shielding device. Further, the present invention relates to a arrangement for electromagnetic shielding of two adjacent relatively movable members having opposed surfaces with a space therebetween. The electromagnetic shielding device includes a resilient cap portion having a center portion and a plurality of segments extending radially outwardly therefrom. An arrangement for retaining the cap portion on one of the surfaces is provided. The retaining arrangement includes a thin disk adapted to be received between the segments of the cap portion and resilient tongues extending radially inwardly from an outer end of each of the segments. The cap portion in a free state has a height which is greater than the distance of the space between the opposed surfaces to be shielded. In this way, the cap portion is compressed to fit within the space upon movement of the members toward one another to ensure electrical connection between the two opposed surfaces.

9 Claims, 5 Drawing Figures

U.S. Patent  Sep. 24, 1985  4,543,447
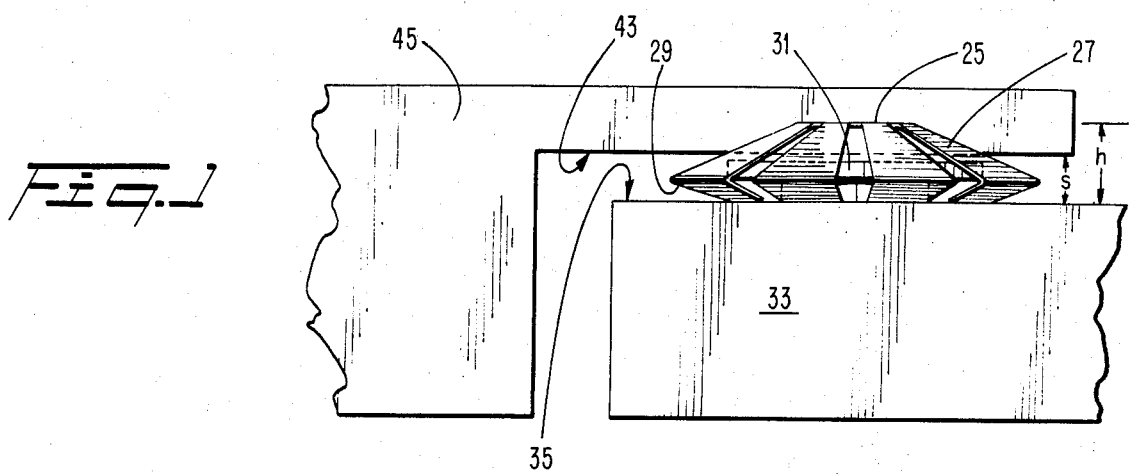
Fig. 1
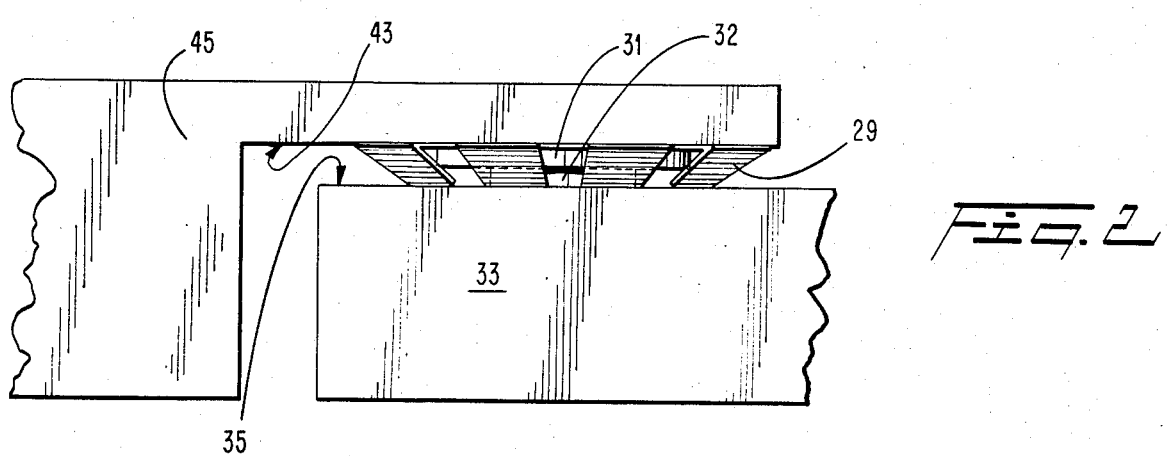
Fig. 2
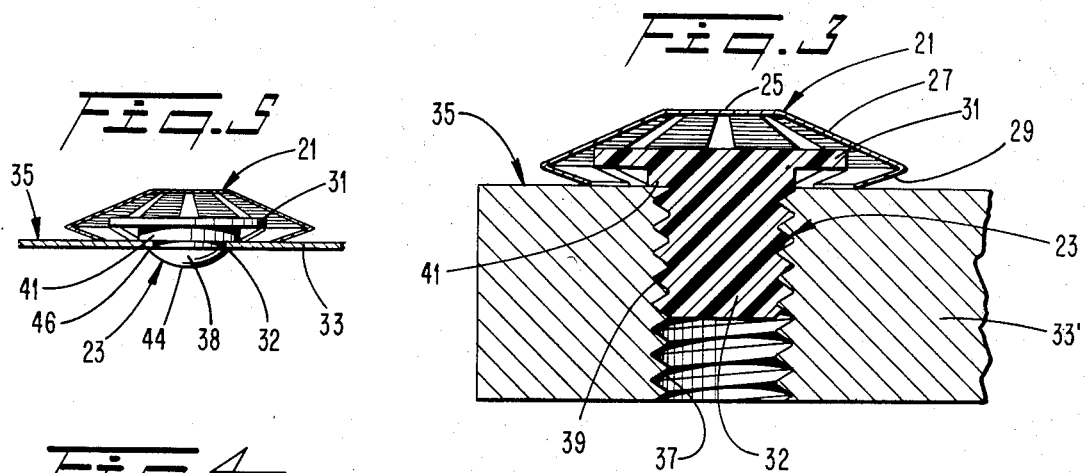
Fig. 5
Fig. 3
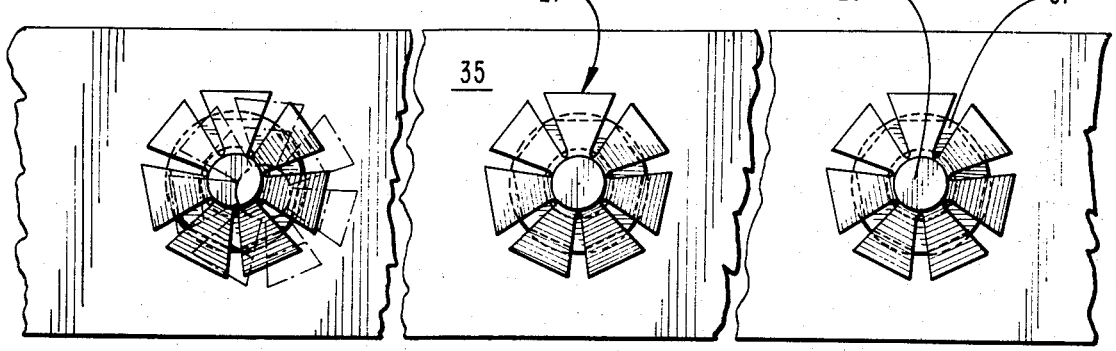
Fig. 4

ELECTROMAGNETIC SHIELDING DEVICE

BACKGROUND AND SUMMARY OF THE PRESENT INVENTION

The present invention relates to electromagnetic shielding devices. More particularly, the present invention relates to an electromagnetic shielding device for shielding two adjacent, relatively movable members having opposed surfaces with a space therebetween.

It has been known that electronic shielding of fixed or movable joints in shielded structures such as test rooms and enclosures for radio transmitters, radio receivers, computers and other equipment is highly desirable. Such structures often have movable members primarily at doors, access panels, drawers and the like. It is highly desirable to shield these joints effectively with conductive surfaces that permit dissipation of electrical charges and thereby isolate the charge within the structure.

Various arrangements for effecting the seal have been proposed. However, many of the prior proposals have been found not to provide proper attenuation due, in part, to poor electrical contact between the opposed surfaces. This problem is particularly acute with surfaces in which the direction of final closure is generally parallel to the surfaces, i.e., doors. The forces transmitted to the shielding arrangement during such a sliding, parallel closing movement are often detrimental to the structure of the known shielding arrangements thereby causing a loss in proper electrical contact between the surfaces. For example, the shielding arrangement may be insufficiently secured to the surface to ensure proper contact therewith particularly with repeated openings and closings of the relatively movable members.

One prior shielding arrangement is disclosed in U.S. Pat. No. 3,504,095 issued Mar. 31, 1970 to Roberson et al. In a preferred embodiment, the Roberson patent discloses an electromagnetic gasket including a longitudinal bearing portion and a curved bearing portion. A plurality of notches divide the curved bearing portion into a row of integral fingers along the entire length of the gasket. The gasket is secured to one of a pair of opposed surfaces by an adhesive along the lower portion of the longitudinal bearing portion.

Other types of electromagnetic shielding arrangements including longitudinal or circular strips arranged upon one of two opposed surfaces are disclosed in U.S. Pat. Nos. 2,825,042 issued Feb. 25, 1958 to Tollefson et al; 2,844,644 issued July 22, 1958 to Soule Jr.; 3,277,230 issued Oct. 4, 1966 to Stickney et al; and 3,904,810 issued Sept. 9, 1975 to Kraus.

Another known joint seal for electromagnetic wave shielding includes spring strips of angular cross section providing an electromagnetic seal between a pair of movable members. The spring strips are confined in opposing pairs under a clamp which is attached by a screw to one of the movable members. An arrangement of this type is disclosed in U.S. Pat. No. 3,962,550 issued June 8, 1976 to Kaiserswerth.

It is an object of the present invention to provide an electromagnetic shielding device which is effective to obtain and retain good electrical contact between surfaces on two relatively movable members even after repeated openings and closings of the members.

It is a further object of the present invention to provide an electromagnetic shielding device which is useful on a wide variety of different types of both surface textures and materials and different types of relative movements between the movable members. Still a further object of the present invention is to provide an electromagnetic shielding device which is not prone to wear with repeated movements of the relatively movable members.

Yet another object of the present invention is to provide an electromagnetic shielding device that is positively retained upon a surface. Further, it is an object of the present invention to provide an electromagnetic shielding device which is relatively inexpensive to manufacture and relatively easy to install.

A still further object of the present invention is to provide an effective arrangement for shielding two opposed surfaces on relatively movable members having a space therebetween.

These objects and others are accomplished by an electromagnetic shielding device and an arrangement for shielding two adjacent, relatively movable members in accordance with the present invention. The shielding device includes a resilient cap portion having a solid center portion and a plurality of segments extending radially outwardly therefrom. The device further includes a retaining member for retaining the cap portion on a surface.

In a preferred embodiment, the shielding device includes radially outwardly extending segments with resilient tongues extending radially inwardly from an outer end of each of the segments. A first portion of the retaining member is adapted to be received within an annular space defined between the segments and the resilient tongues. The first portion of the retaining member preferably comprises a disk while the retaining member includes a second portion adapted to be secured to the surface. Further in the preferred embodiment, the cap portion includes an odd number of segments such that mechanical stresses on the cap portion when initially engaged in sliding contact between the two surfaces is minimized.

In accordance with a further aspect of the present invention, the arrangement for electromagnetic shielding of two adjacent relatively movable members having opposed surfaces with a space therebetween includes a plurality of individual spaced apart shielding elements arranged on one of the surfaces. Each element comprises a resilient cap portion and an arrangement for retaining the cap portion on the one surface. A height of the cap portion from the surface in a free state is greater than the distance of the space between the opposed surfaces such that the cap portion is compressed to fit within the space upon movement of the members toward one another. It is further preferred that the spacing between adjacent ones of the plurality of shielding elements is less than one half of the wavelength of the highest frequency to be shielded.

BRIEF DESCRIPTION OF THE DRAWINGS

A preferred embodiment of the present invention will be described in greater detail with reference to the accompanying drawings, wherein like members bear like reference numerals and wherein:

FIG. 1 is a side view of a shielding device according to the present invention secured to a surface of one of two relatively movable members prior to movement of the members to a closed position;

FIG. 2 is a side view of the movable members and shielding device of FIG. 1 with the movable members in a closed position with the surfaces opposite one another;

FIG. 3 is a cross-sectional view illustrating a first embodiment for securing the shielding device according to the present invention to the surface of one of the movable members;

FIG. 4 is a top view of a portion of one of the members with a plurality of shielding devices according to the present invention secured thereto with movement of a shielding device relative to the surface illustrated in the left portion of the figure; and FIG. 5 is a cross-sectional view illustrating a second embodiment for securing the shielding device to the movable member surface.

DETAILED DESCRIPTION OF THE PREFERRED EMBODIMENT

With reference to FIG. 3, an electromagnetic shielding device according to the present invention includes a cap portion 21 and a retaining member 23. The cap portion 21 includes a center portion 25 and a plurality of segments 27 extending generally radially from the center portion 25 to define an outer circumference of the cap portion 21. The segments 27 extend at an obtuse angle (measured internally) relative to the plane of the center portion 25 to present a hat-like configuration. Each of the segments 27 has a resilient tongue 29 arranged at an outer end thereof and extending generally radially inwardly at an acute angle (measured internally) relative to the respective segment 27. The tongues 29 extend radially inward only a relatively short distance to define an inner circumference of the cap portion 21. In other words, a semi-closed annular space is provided between an upper surface of the resilient tongues 29 and a lower surface of the segments 27. The cap 21 is provided with a desired resiliency by reason of the angled connections of the segments 27 to the center portion 25 and the segments 27 to the tongues 29. In other words, upon the application of a force generally downwardly against the center portion 25, the angled connections of the segments 27 to both the center portion 25 and to the tongues 29 are flexed.

The retaining member 23 of the shielding device includes a head portion 31 and a base portion 32. The head portion 31 is generally in the form of a thin disk having a thickness which is sufficiently small to permit the disk to fit within the semi-closed annular space defined between the segments 27 and the resilient tongues 29. In this way, the cap portion 21 is retained on the head portion 31 of the retaining member 23. As can be seen in FIG. 3, the cap portion, in a free state, and the retainer member together have a somewhat mushroom-shaped appearance. It should be noted that the diameter of the head portion 31 of the retaining member 23 is less than the diameter of the outer circumference of the cap portion 21 defined by the segments 27 and the inner circumference of the cap portion 21 defined by the resilient tongues 29. In this way, limited relative movement between the cap portion 21 and the head portion 31 of the retaining member 23 is permitted.

It should be noted that the particular configuration of the cap portion 21 thus serves both to loosely secure the cap portion to the retaining member 23 and to provide an improved resiliency for the shielding device. By having an angled connection at each end of each segment (one of which tends to become generally planar and one of which tends to become folded on itself) which connections are flexed in use, improved resiliency over shielding devices having only one angled connection is provided.

The base portion 32 of the retaining member 23 is adapted to be secured to a member 33 such as a door, a drawer or the like. The member 33 carries a surface 35 which is one of two opposed surfaces having a space therebetween (when the members are in a closed configuration) which space is to be shielded by the device according to the present invention. The retaining member 23 may be secured to the member 33 in any suitable manner.

In a preferred embodiment (FIG. 5), the retaining member comprises a rivet-like element 38 which is secured within an opening 40 provided through a relatively thin wall 42 of the member 33, for example, a drawer or a door. The rivet-like element 38 is secured within the opening 40 by compressing an enlarged portion 44 at a base of the element 38 through the opening 40 which is of slightly smaller diameter than the enlarged portion 44. Edges 46 of the enlarged portion 44 then spring radially outwardly to engage a back surface of the wall 42. The rivet-like element 38 is preferably comprised of plastic to facilitate the compression of the enlarged portion 44 of the element 38. Such a rivet-like securement is readily adaptable for use on any surface texture or material.

The retaining member 23 is secured to the member 33 such that a space exists between a lower surface of the head portion 31 and the surface 35 of the member 33. In order to prohibit the head portion 31 of the retaining member 23 from being secured too close to the surface 37, a stop 41 is preferably provided below the head portion 31 of the retaining member 23 to ensure proper spacing of the head portion 31 from the surface 35. The stop 41 may be integral with the retaining member 23 or may be a separate washer provided about the base portion 32 of the retaining member 23.

The cap portion 21 is arranged over the head portion 31 of the retaining member 23 such that the head portion 31 lies within the annular space defined between the segments 27 and the resilient tongues 29. Accordingly, the cap portion 21 is also retained on the surface 35 of the member 33. Also, the center portion 25 of the cap portion 21 in a free state is spaced from an upper surface of the head portion 31 of the retaining member 23. In this way, limited movement of the cap portion 21 generally perpendicular to the surface 35 is permitted. Also, flexure of the cap portion 21 is freely permitted as will be described in greater detail subsequently.

In another embodiment (FIG. 3), the base portion 32 of the retaining member 23 is secured within a threaded bore 37 provided in a member 33'. Threads 39 on the base portion 32 cooperate with the threads of the bore 37 to securely hold the retaining member 23 within the movable member 33'. The threaded retaining member 23 is particularly adapted for thick-walled members 33'. Alternatively, the retaining member 23 may be secured by an adhesive to the surface 35 of the member 33 or 33'. It should be noted that adhesive securement of the retaining member 23 is primarily only acceptable for smooth surfaces.

With reference to FIG. 4, a plurality of electromagnetic shielding devices according to the present invention are arranged along the length of the surface 35. Movement of the cap portions 21 relative to the retaining members 23 of the device, i.e., movement parallel to the surface 35, is illustrated on the left hand side of FIG. 4. The spacing between adjacent ones of the electromagnetic shielding devices is selected in accordance with the anticipated frequencies to be shielded. In order to provide proper attenuation of the electromagnetic waves, the distance between adjacent ones of the shielding devices should be less than one half the wavelength of the highest frequency to be shielded. In general, the frequencies to be shielded have wavelengths greater than 2 inches and up to several feet. In actual practice, the spacing between adjacent ones of the shielding devices is primarily determined by the geometry of the member to which the devices are attached and is conveniently a maximum of generally 8 to 10 inches. While the shielding devices of FIG. 4 are illustrated as being in a single, generally straight line, other orientations, e.g., staggered or multiple rows, may be utilized. A suitable configuration of the shielding devices is readily apparent to one skilled in the art and is likely to be determined by the shape and size of the surface 35.

In the preferred embodiment, the diameter of the cap portion of the shielding device is between ¼ and 1 inch, preferably about ½ inch. Also, the cap portion 21 is made from a conductive metal alloy which may be easily shaped into the desired configuration without breakage. In the preferred embodiment, the entire cap portion 21 is formed from a single piece of an electrically conductive metal while in a soft condition. After formation, the metal is heat treated for stability. A beryllium copper alloy has been found to be particularly amenable to the formation process without risk of breakage. However, an aluminum copper alloy may also be utilized. Also in the preferred embodiment, the retaining member 23 is molded from a single piece of plastic, for example, by injection molding. It should be noted that the retaining member 23 may be made of metal or any other desired material.

In operation, the member 33 upon which the shielding device according to the present invention is secured is moved to a position in which the surface 35 lies directly across from a surface 43 on a second member 45 (FIG. 2). For example, the member 33 may be a door while the member 45 constitutes a portion of an enclosure with which the door is adapted to cooperate. With a door and other types of closure members, the two surfaces 35, 43 move generally parallel to one another during final closing movement of the members to place the surfaces directly opposite to one another.

With reference to FIG. 1, as the member 33 is moved toward the member 45 (in a direction generally perpendicular to the plane of FIG. 1) and prior to locating the surfaces directly opposite to one another, a portion of the segments 27 abut the edge of the member 45. This abutment occurs since the cap portion 21 has a height h above the surface 35 of the member 33 in a free state which height h is greater than the distance s between the opposed surfaces 35, 43 on the two relative movable members 33, 45. Upon contact between the segments 27 and the edge of the second member 45, the connections of the abutted segments 27 to the cap portion 21 and to the tongues 29 are resiliently flexed. The angled connections of the segments 27 to the center portion 25 are urged into a generally planar configuration and the angled connections of the segments 27 to the tongues 29 are compressed. This compression causes the angle between the segments 27 and the center portion 25 to approach 180°. Due to the small width of the angled connection between the segments 27 and the center portion 25 relative to the width of the angled connections between the segments 27 and the tongues 29 (FIG. 4), the angle between the segments 27 and the cap portion 25 tends to change, i.e., approaches 180°, more readily than the angle between the segments 27 and the tongues 29 changes, i.e., decreases. Accordingly, upon closure of the members 33,45, the central portion 25 of the cap portion 21 moves toward the upper surface of the head portion 31 of the retaining member 23.

Upon further movement of the member 33, all of the angled connections of the segments are flexed and the entire cap portion 21 is progressively compressed to fit within the space between the opposed surfaces 35, 43 (FIG. 2). In this way, good electrical contact with both of the opposed surfaces is ensured. In particular, the central portion 25 of the cap member 21 is urged against the surface 43 of the second member 45 by the resilient tongues 29 acting against the surface 35 while the resilient tongues 29 maintain contact with the surface 35 of the first member 33. This compression or flexure of the cap portion 21 is permitted since the center portion 25 is spaced from the upper surface of the head portion 31 of the retaining member 23 and since the head portion 31 is spaced from the surface 35 of the first member 33. It should be apparent that the distance of the head portion 31 from the surface 35 is less than the distance s between the opposed surfaces 35, 43.

In accordance with a further aspect of the present invention, the cap portion 21 is provided with an odd number of segments 27 (FIG. 4). In this way, resistance to closure of the first member 33 relative to the second member 45 when the segments 27 abut the second member 45 is minimized. In particular, if an even number of segments 27 were provided on the cap portion 21, two of the segments 27 with their resilient tongues 29 in contact with the surface 35 are likely to be aligned perpendicular to the direction of the closing movement. In such an instance, the two aligned tongues 29 perpendicular to the direction of movement cause an increased amount of friction to resist movement of the cap portion 21 as the surface 35 is moved parallel to the second surface 43 thereby rendering closure of the member 33 more difficult. Further, such resistance may cause unwanted bending and/or stressing of the cap portion 21 leading to an improper shielding effect or early fatigue failure. By providing an odd number of segments 27 on the cap portion 21, the problem of two segments 27 being aligned is eliminated (FIG. 4). The cap portion 21 is readily compressible irrespective of the direction of movement of the first member 33 relative to the second member 45. In other words, the deflection of the cap portion 21, due to the radially extending segments 27, is substantially uniform in a radial direction during compression. Consequently, the cap portion 21 may abut the second surface 43 from any desired angle thereby accommodating a wide variety of different directions of closing movements of the members.

The present invention provides a relatively simple yet highly effective device for electromagnetic shielding of two relatively movable surfaces. The device may be readily mounted to any type of surface and ensures proper electrical contact between two opposed surfaces upon closure. Further, since the compression of the device is substantially uniform in a radial direction, undue stresses are not developed in the device during repeated closures of the members from any direction. Accordingly, breakage and/or deformation of the device is minimized.

The principles, preferred embodiment and mode of operation of the present invention have been described in the foregoing specification. However, the invention which is intended to be protected is not to be construed as limited to the particular embodiments disclosed. The embodiments are to be regarded as illustrative rather than restrictive. Variations and changes may be made by others without departing from the spirit of the present invention. Accordingly, it is expressly intended that all such variations and changes which fall within the spirit and scope of the present invention as defined in the claims be embraced thereby.

What is claimed is:

1. An arrangement for electromagnetic shielding of two adjacent relatively movable members having opposed surfaces with a space therebetween, the arrangement comprising at least one individual shielding element arranged on one of said surfaces, each shielding element comprising a generally circular resilient cap portion having a plurality of radially extending segments and resilient tongues extending radially inwardly from an outer end of each of the segments to define a semi-closed, generally annular space between the segments and the tongues and means for retaining said cap portion on said one of said surfaces, said cap portion overlying said retaining means.

2. The arrangement according to claim 1, wherein said cap portion includes an odd number of segments.

3. The arrangement according to claim 1, further comprising a plurality of spaced apart shielding elements, the spacing between adjacent ones of the plurality of shielding elements being less than one-half of the wavelength of the highest frequency to be shielded.

4. An arrangement for electromagnetic shielding of two adjacent relatively movable members having opposed surfaces with a space therebetween, the arrangement comprising at least one individual shielding element arranged on one of said surfaces, each shielding element comprising a generally circular resilient cap portion having a plurality of radially extending segments and means for retaining said cap portion on said one of said surfaces, a height of said cap portion from said one of the surfaces in a free state being greater than the distance of the space between the opposed surfaces, said cap portion being compressible to fit within the space upon movement of said members toward one another, said cap portion including resilient tongues extending radially inwardly from an outer end of each of the segments to define a semi-closed, generally annular space between the segments and the tongues.

5. The arrangement according to claim 4, wherein the means for retaining the cap portion comprises a head portion and a base portion for securing the retaining means to the one of said surfaces, the head portion being received within the annular space.

6. The arrangement according to claim 5, wherein a diameter of the head portion is sufficiently less than the diameter of the individual cap portions to permit limited movement of the cap portion generally parallel to the surface.

7. The arrangement according to claim 5, wherein the head portion is spaced sufficiently from the surface to permit limited movement of the cap portion perpendicular to the surface.

8. The arrangement according to claim 7, wherein a stop is provided on the retaining means for limiting movement of the head portion toward the surface.

9. The arrangement according to claim 5, wherein the base portion of the retaining means includes threads adapted to cooperate with threads in a bore through the one of said surfaces.

* * * * *